United States Patent [19]
Hayes et al.

[11] Patent Number: 5,229,016
[45] Date of Patent: Jul. 20, 1993

[54] METHOD AND APPARATUS FOR DISPENSING SPHERICAL-SHAPED QUANTITIES OF LIQUID SOLDER

[75] Inventors: Donald J. Hayes, Plano; Michael T. Boldman, Garland; David B. Wallace, Dallas, all of Tex.

[73] Assignee: MicroFab Technologies, Inc., Plano, Tex.

[21] Appl. No.: 742,362

[22] Filed: Aug. 8, 1991

[51] Int. Cl.$^5$ .............................................. B22D 37/00
[52] U.S. Cl. .................................... 222/590; 222/593; 222/595
[58] Field of Search .................. 222/590, 593, 595; 266/239, 45

[56] References Cited

U.S. PATENT DOCUMENTS

| | | | |
|---|---|---|---|
| 4,527,717 | 7/1985 | Emoto et al. | 222/593 |
| 4,828,886 | 5/1989 | Hieber | 222/593 |

Primary Examiner—Scott Kastler
Attorney, Agent, or Firm—Jack A. Kanz

[57] ABSTRACT

A method and apparatus for producing solidified solder balls and for ejecting generally spherical-shaped drops of liquid solder through a controlled atmosphere to impact on a surface to be wetted is disclosed. The apparatus comprises a preload reservoir to hold and maintain solder in a liquid state, an ejection chamber to hold and maintain the solder in a liquid state, a connection between the preload reservoir and the ejection chamber to allow liquid solder in the preload reservoir to be transferred to the ejection chamber while maintaining the oxides in the preload reservoir, a device to pressurize the ejection chamber with an inert gas and an ejection device operatively connected to receive liquid solder from the ejection chamber and to eject generally spherical-shaped drops of liquid solder to a specific location on a surface to be wetted. Structure is included to provide an atmosphere of inert gas between the ejection device and the specific location on a surface to be wetted.

The method includes the steps of maintaining solder in a liquid state in a reservoir, transferring solder in the liquid state from the reservoir to an ejection chamber, maintaining the transferred solder in a liquid state in the ejection chamber, pressurizing the ejection chamber with an inert gas, transferring solder in the liquid state from the ejection chamber to an ejection device, ejecting generally spherical-shaped drops of liquid solder from said ejection device to a specific location on a surface to be wetted. An atmosphere of inert gas is provided between the ejection device and the specific location on a surface to be wetted.

34 Claims, 8 Drawing Sheets

110 μm Diameter Solder Balls

Array Of 110 μm Diameter Solder Bumps On A Copper Substrate

110 μm Diameter Solder Bump On A Copper Substrate

METHOD AND APPARATUS FOR DISPENSING SPHERICAL-SHAPED QUANTITIES OF LIQUID SOLDER

TECHNICAL FIELD OF THE INVENTION

This invention relates generally to dispensing of liquid solder. More particularly, but not by way of limitation, this invention relates to methods and apparatus for producing spherical-shaped quantities of melted solder of accurately known size and applying the spherical-shaped quantities with great accuracy to very small soldering areas to be wetted.

BACKGROUND OF THE INVENTION

Although this invention is applicable to the dispensing of various liquids, it has been found particularly useful in the environment of dispensing very small solder balls to very small soldering areas. Therefore, without limiting the applicability of the invention to "dispensing very small solder balls to very small soldering areas", the invention will be described in such environment.

In a high density electronic manufacturing process, semiconductor integrated circuit chips are bonded to a substrate by a solder reflow process. In the prior art and with reference to FIG. 1, the semiconductor integrated circuit chip or chip 10 is shown operatively joined to substrate 12 after the solder reflow process has been completed.

Also in the prior art and with reference to FIG. 2, the interconnect material between the chip 10 and the substrate 12 is in the form of a solder bump 14 prior to the solder reflow process. The solder bumps 14 are placed on the pads 16 of the integrated circuit chip or chip 10 by one of various prior art processes which include 1) deposition through a mask plus solder reflow, 2) electroplating plus solder reflow, 3) pick-and-place of $ solder bumps, etc. The actual bonding process utilizes solder bumps which are deposited on the wettable metal pads 16 on the chip 10. Chip 10 (the upside-down chip or flip chip) is then flipped over (see FIG. 2) and the solder bumps 14 are aligned with the correct matching o footprint of solder wettable terminals or connect pads or bond pads 18 on the substrate 12. Heat is then applied and all joints or interconnects between the pads 16 on the chip 10 and the solder wettable terminals or connect pads or bond pads 18 on the substrate 12 are made simultaneously by reflowing the solder in the solder bumps 14. Typically, the interconnects are made with solder bumps 14 which are 100 to 150 $\mu$m (microns) in diameter with several hundred to several thousand solder bumps per chip. The electronic manufacturing process is moving toward more interconnects per chip which requires solder bumps of a smaller size since the interconnects are closer together.

With reference to FIGS. 3 and 4, the prior art method of deposition of solder through a mask plus reflow for creating solder bumps 14 is disclosed. Solder is evaporated through apertures or holes 20 in a metal mask 22 which has been aligned over the metal pads 16 on chip 10 with the metal pads 16 being surrounded by insulation 24. In this way an array of solder deposits 26 comprising tin 28 and lead 30 is created on the surface of the chip 10. This method is a batch process. The composition of the evaporated solder deposits 26 depends upon the starting composition of the solder and the vapor pressures of the respective metals comprising the solder. Reflow in a furnace homogenizes the solder deposits 26 and brings the solder deposits 26 to a spherical shape or solder bumps 14 as shown in FIG. 4. The metal pads 16 are wettable by the solder bumps 14 while the insulation 24 is not. Some disadvantages of this process include the high overall cost of the process. The quality and repeatability of the solder alloy is not good and the masks get coated with the solder materials and must be continuously cleaned or thrown away.

Another process for creating solder bumps 14 is the electroplating process plus reflow and consists of application of photoresist material on the chip, exposure to a masked ultraviolet beam to define a pattern in the photoresist material, development of the pattern in the photoresist material and then electroplating with the solder composition. Reflow in a furnace brings the solder deposits to a spherical shape similar to that in FIG. 4. Some disadvantages of this process include the high overall cost of the process because of the photolithograph and the solder plating step presents environmental waste treatment problems. Furthermore the solder alloy is not consistent and usually contains impurities.

Another process for creating solder bumps 14 is the pick-and-place method wherein solder balls are created off line using processes developed for the creation of lead shot. The solder balls are then inspected and those which do not meet specifications are discarded. The solder balls are arranged in grooves in a tray and a robot arm generates the pick-and-place action and picks up solder balls, one at a time and, with the application of heat and pressure, positions each solder bump on an individual pad 16 on chip 10. Some disadvantages of this process include the high cost of the equipment needed for the process, the fact that the process is not suitable for volume production and the danger to individuals in handling and controlling the small solder balls.

SUMMARY OF THE INVENTION

This invention provides a method and apparatus for producing solidified solder balls and for ejecting generally spherical-shaped drops of liquid solder through a controlled atmosphere to impact on a surface to be wetted. The apparatus comprises a preload reservoir to hold and maintain solder in a liquid state, an ejection chamber to hold and maintain the solder in a liquid state, a connection between the preload reservoir and the ejection chamber to allow liquid solder in the preload reservoir to be transferred to the ejection chamber while maintaining the oxides in the preload reservoir, means to pressurize the ejection chamber with an inert gas and an ejection device operatively connected to receive liquid solder from the ejection chamber and to eject generally spherical-shaped drops of liquid solder to a specific location on a surface to be wetted. Means are included to provide an atmosphere of inert gas between the ejection device and the specific location on a surface to be wetted.

The method includes the steps of maintaining solder in a liquid state in a reservoir, transferring solder in the liquid state from the reservoir to an ejection chamber, maintaining the transferred solder in a liquid state in the ejection chamber, pressurizing the ejection chamber with an inert gas, transferring solder in the liquid state from the ejection chamber to an ejection device, and ejecting generally spherical-shaped crops or liquid solder from said ejection device to a specific location on a surface to be wetted. An atmosphere of inert gas is provided between the ejection device and the specific location on a surface to be wetted.

BRIEF DESCRIPTION OF THE DRAWINGS

Other advantages and features of the invention will become more apparent with reference to the following detailed description of a presently preferred embodiment thereof in connection with the accompanying drawings, wherein like reference numerals have been applied to like elements, in which.

DETAILED DESCRIPTION

Figure 1:
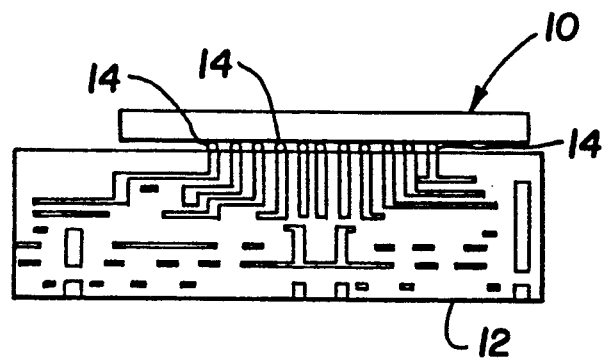
FIG. 1 is a simplified pictorial illustrating the prior art integrated circuit chip bonded to a substrate.
Figure 2:
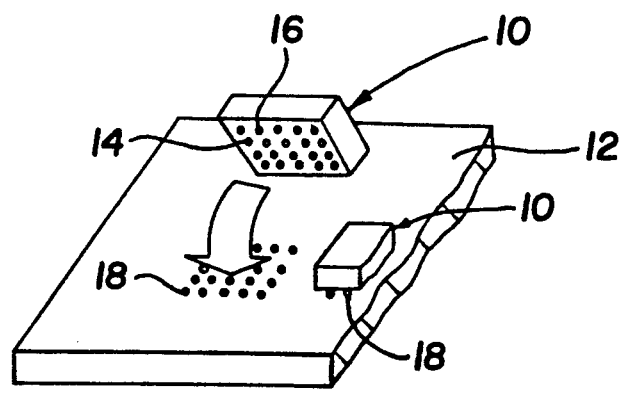
FIG. 2 is a simplified pictorial illustrating one step in the prior art bonding of an integrated circuit chip to a substrate.
Figure 3:
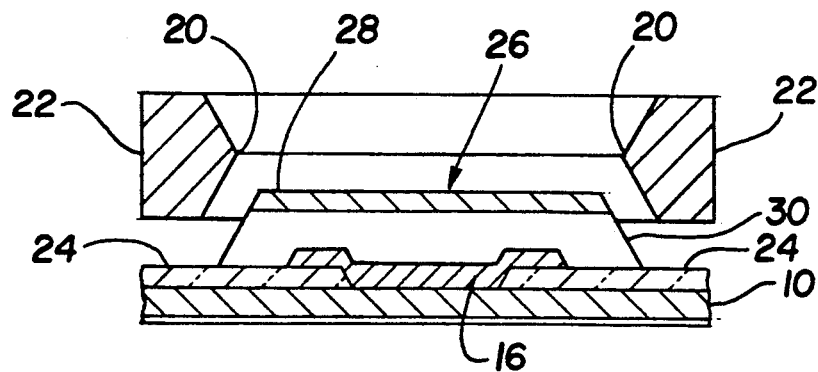
FIG. 3 is a simplified pictorial illustrating one step in the prior art deposition method of providing solder bumps on an integrated circuit chip.
Figure 4:
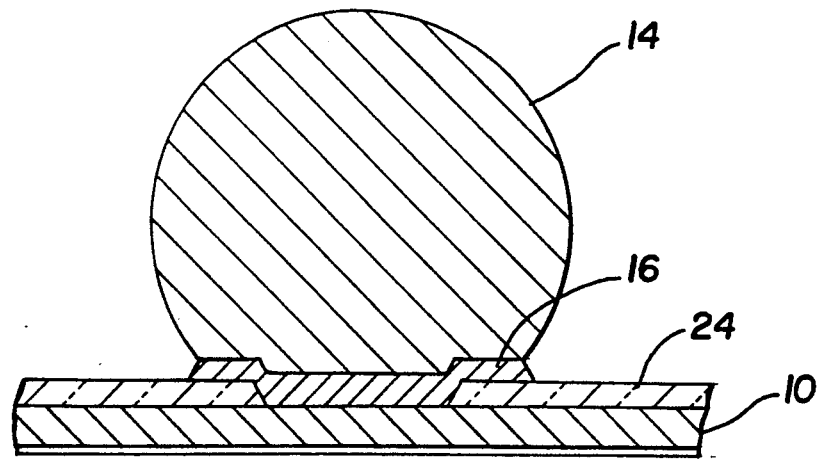
FIG. 4 is a simplified pictorial illustrating a solder bump after reflow in the prior art deposition method.
Figure 5:
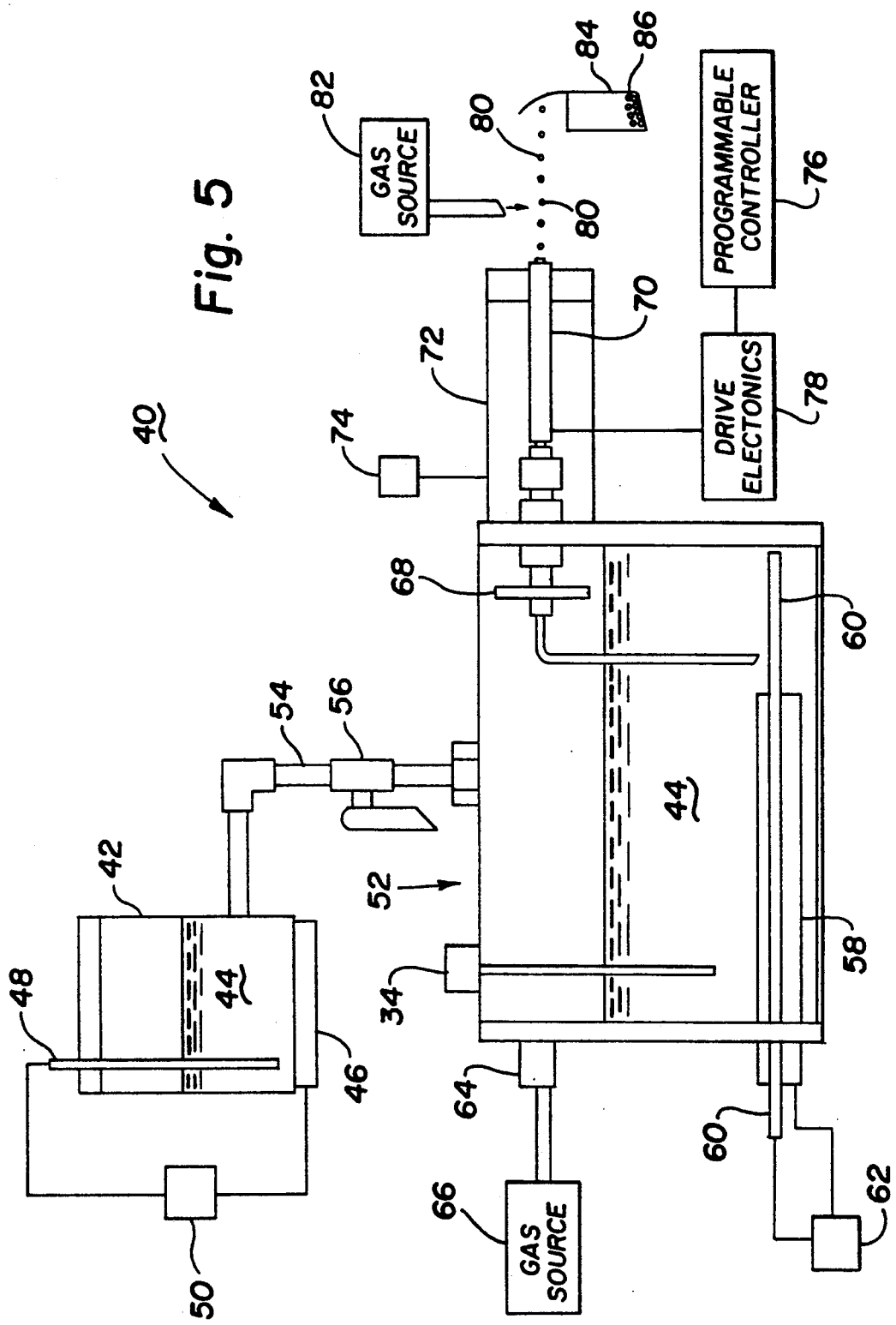
FIG. 5 is a simplified pictorial illustrating apparatus constructed in accordance with the present invention for dispensing spherical-shaped quantities of liquid solder.

Referring to the drawing and FIG. 5 in particular, shown therein and generally designated by the reference character 40 is solder ejecting apparatus constructed in accordance with the present invention and which is capable of not only producing and ejecting spherical-shaped quantities of liquid solder which can be caught in a container but is capable of producing and ejecting spherical-shaped quantities of liquid solder and applying the spherical-shaped quantities of liquid solder with great accuracy to very small soldering areas or surfaces to be wetted which includes wettable metal pads on an integrated circuit chip and connect or bond pads on a packaging substrate.

As illustrated, the solder ejecting apparatus 40 comprises a preload reservoir 42 for initially receiving and holding solder 44 in a liquid state. Heating element 46 is operatively positioned in preload reservoir 42 to maintain the solder 44 in a liquid state. Thermocouple 48 is connected to power source 50 so the solder 44 will be maintained in a liquid state. An ejection chamber 52 is connected to the outlet of preload reservoir 42 through conduit 54 and valve 56 to allow liquid solder 44 to flow from the preload reservoir 42 into ejection chamber 52. The oxides and impurities tend to stay at the top of the liquid solder 44 in the preload reservoir 42 and do not enter the ejection chamber 52. Heating element 58 is operatively positioned in ejection chamber 52 to maintain the solder 44 in a liquid state. Thermocouple 60 is connected to power source 62 so the solder 44 will be maintained in a liquid state. The ejection chamber 52 is pressurized through inlet port 64 by an inert gas from gas source 66 which forces liquid solder 44 through filter 68 into the ejection device 70 to purge the system in preparation for operation. Although the ejection chamber 52 is not pressurized during operation, the space above the liquid solder 44 is filled with an inert gas to eliminate any oxygen in the atmosphere above the liquid solder 44. Heater 72 surrounds ejection device 70 and controls the temperature of the liquid solder 44 within the ejection device 70. Heater 72 is connected to power source 74. Programmable controller 76 provides activating signals to drive electronics 78 whose output causes ejection device 70 to eject a drop or drops 80 of liquid solder 44 which is controlled by the particular program in programmable controller 76.

The atmosphere surrounding the drops 80 of liquid solder 44 leaving ejection device 70 is filled with an inert gas to eliminate oxygen in the space traveled by the drops 80. A gas source 82 provides a flow of inert gas into the space traveled by the drops.

It is critical that the atmosphere in the ejection chamber 52 and in the space traveled by the drops 80 of liquid solder 44 be devoid of oxygen. The inert atmosphere greatly enhances forming spherical-shaped drops of liquid solder which are solidified into spherical-shaped balls of solder.

As illustrated in FIG. 5, ejection device 70 comprises a drop-on-demand ejection device employed to produce drops 80 of solder 44 in the form of solder balls 86. The balls 86 are solidified drops 80 of solder 44 and which are very uniform in shape size caught in container 84 for use where needed. The solder balls 86 are spherical in shape. In the preferred embodiment, solder balls 86 can be provided which range in diameter from 25 μm to 200 μm with the size of the solder balls 86 varying with the size of the nozzle of the ejection device 70 and the magnitude and frequency of the pulses from drive electronics 78.

Figure 6:
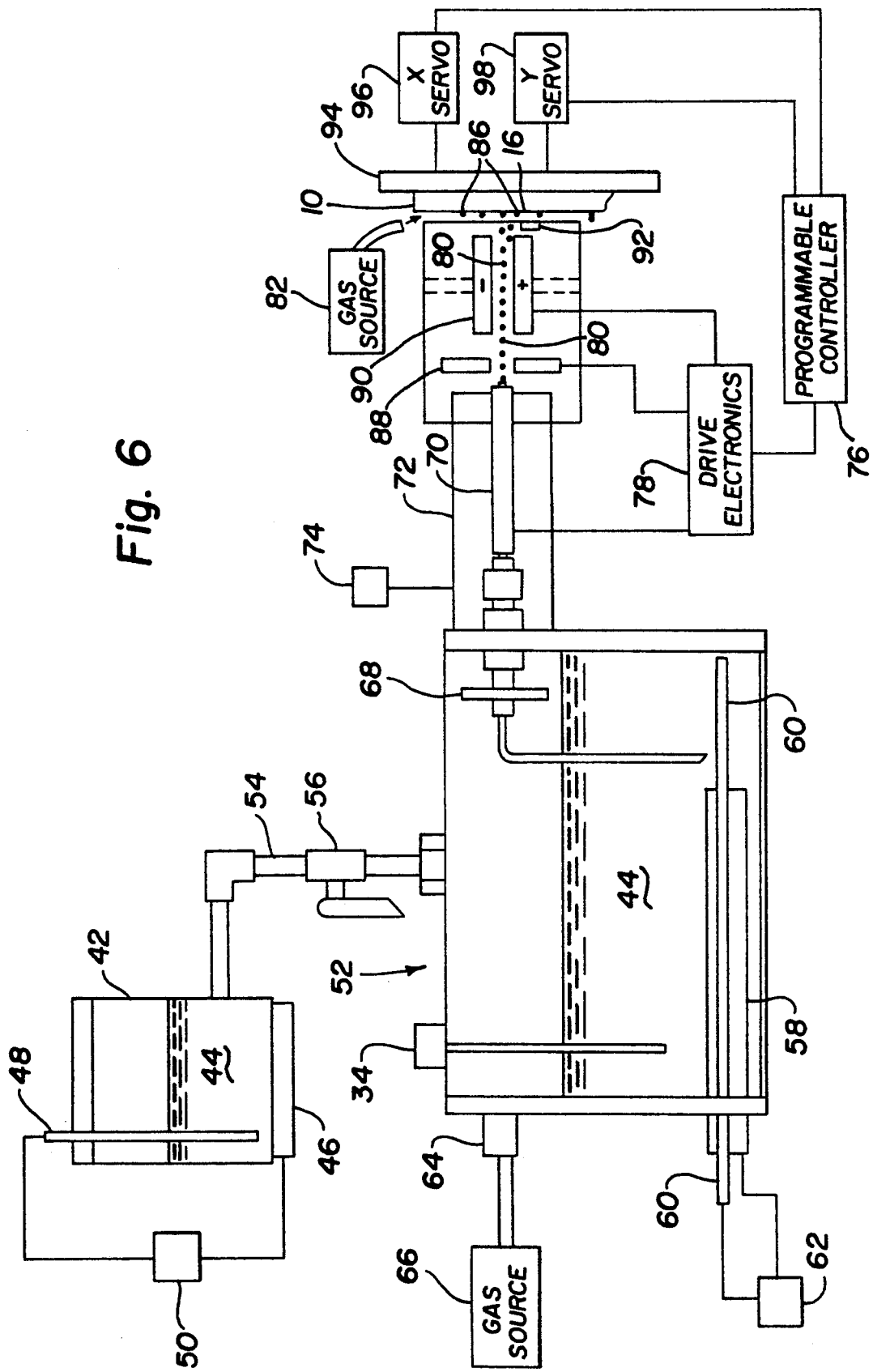
FIG. 6 is a simplified pictorial illustrating apparatus constructed in accordance with the present invention dispensing spherical-shaped quantities of liquid solder to soldering areas to be wetted.

As illustrated in FIG. 6, ejection device 70 comprises a charge-and-deflection ejection device employed to produce drops 80 of solder 44 in the for of solder balls 86 which are solidified drops 80 of solder 44 after being ejected to metal pads 16 on chip 10 and connect or bond pads 18 on substrate 12. The solder balls 86 are spherical in shape and are very uniform in shape and size and are accurately positioned on the metal pads 16 on chip 10. With the charge-and-deflection type of ejection device, ejection chamber 52 is pressurized by an inert gas from gas source 66 and is maintained in a pressurized state during operation to produce the ejection of the spherical-shaped quantities of liquid solder.

In this embodiment, the ejected drops 80 of liquid solder 44 are charged to a predetermined polarity by applying a voltage of the proper polarity and magnitude to charge plates 88. The charged drops of liquid solder travel through an electric field created by the application of a high voltage to a pair of deflection plates 90. Depending upon the charge applied to the drops 80 of liquid solder 44, the drops 80 will be deflected to desired metal pads 16 on chip 10 or will be deflected to catcher 92. The metal pads 16 are maintained at a cooler temperature than the drops 80 which form solder balls 86 on the pads 16.

It will be appreciated that rather than deflecting or moving the drops 80 of liquid solder 44, chip 10 could be moved by mounting chip 10 on an X-Y table 94 which is equipped with an X-axis positioning servo 96 and a Y-axis positioning servo 98. Programmable controller 76 is operatively connected to the X-axis positioning servo 96 and the Y-axis positioning servo 98 and is structured to provide programmed control signals thereto to move the X-Y table 94 to a particular desired location and/or a predetermined sequence of locations with respect to ejection device 70.

It will be appreciated that the drop-on-demand of ejection device FIG. 5 could be used in lieu of the charge-and-deflection ejection device of FIG. 6 with the X-Y table 94 being used to position the chip 10.

Figure 7:
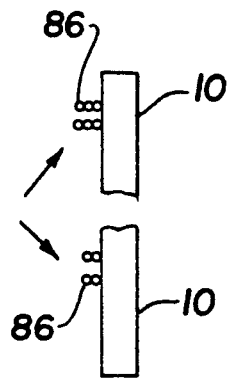
FIG. 7 is a simplified pictorial illustrating the stacking of solder balls on an integrated circuit chip.

With reference to FIG. 7, the height of the stack 100 of solder balls 86 can be easily changed by ejecting more than one drop 80 of liquid solder 44 onto a pad 16 of chip 10. Higher stacks of solder balls 86 provide better reliability during temperature cycling (less shear stress in the solder joint).

Figure 8:
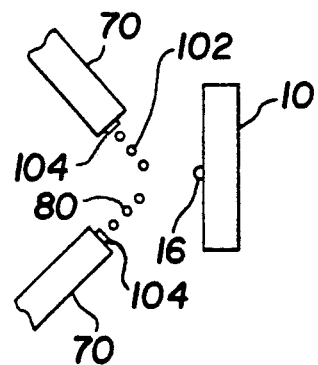
FIG. 8 is a simplified pictorial illustrating the application of flux and solder on a pad.

With reference to FIG. 8, an additional ejection device 70 is operatively connected to a different ejection chamber 52 which contains liquid flux 102. It will be appreciated that spherical-shaped drops of liquid flux 102 may be dispensed just before or at the same time the drop or drops 80 of liquid solder 44 is dispensed so that the drop or drops of liquid flux 102 arrives at the wettable metal pads 16 just before or at the same time as the arrival of the drop or drops 80 of liquid solder 44.

In the preferred embodiment, the ejection device 70 comprises a piezoelectric transducer which operates in the normal manner. The basic difference from an ink jet transducer is that the materials are selected which will withstand the temperature of liquid solder.

Figure 9:
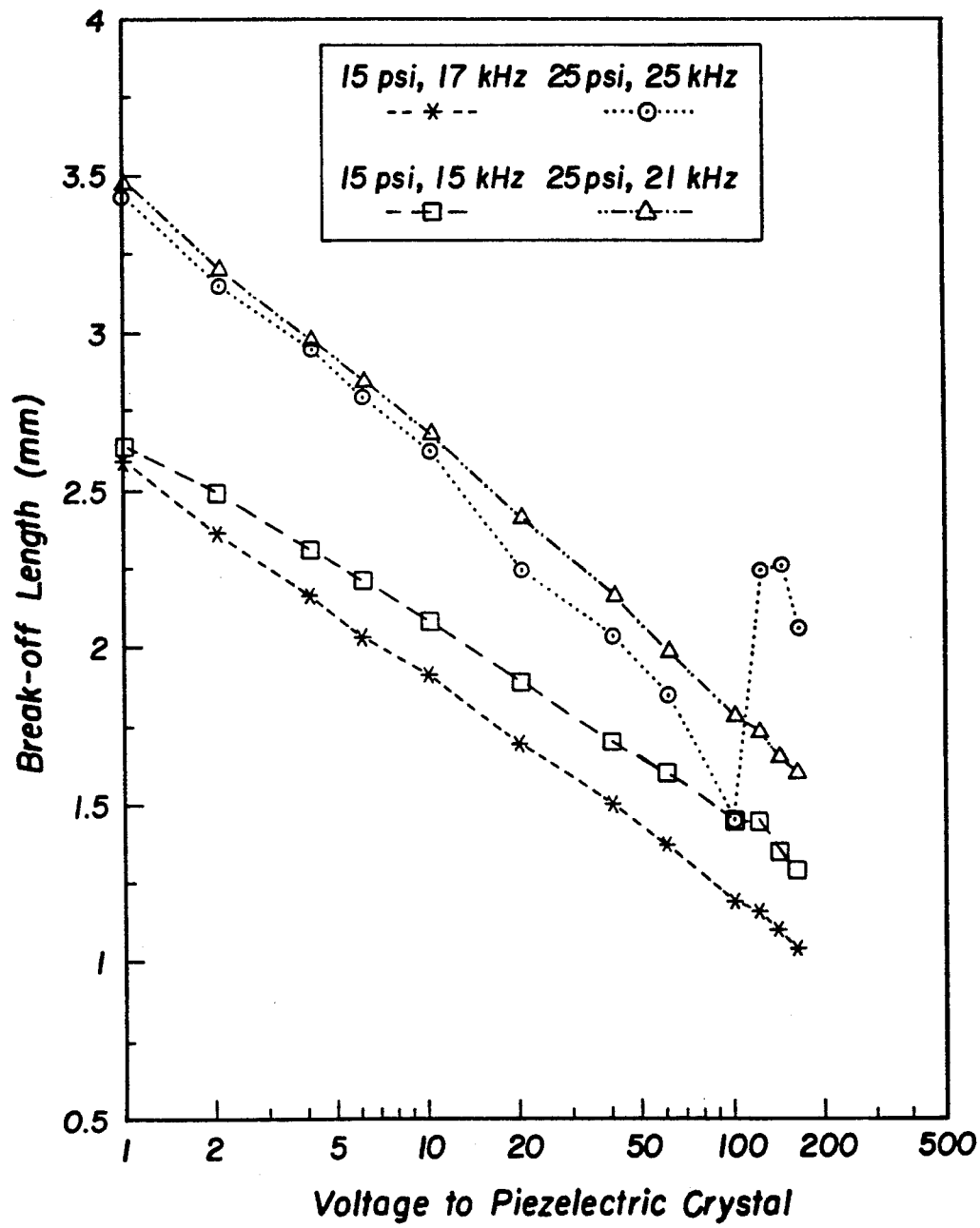
FIG. 9 is a graphic illustration of break-off length vs voltage of solder balls formed under various conditions.

FIG. 9 depicts the results of operation of the drop-on-demand ejection device 70 under various conditions of pressurization of the ejection chamber 52, frequency of excitation of the ejection device 70 and the voltage to the piezoelectric transducer of the ejection device 70. The generally linear curves demonstrate that the ejection device 70 operates in a very controlled manner with good repeatability. Break-off length describes the distance from the orifice at which the droplets detach from the jet.

Figure 10:
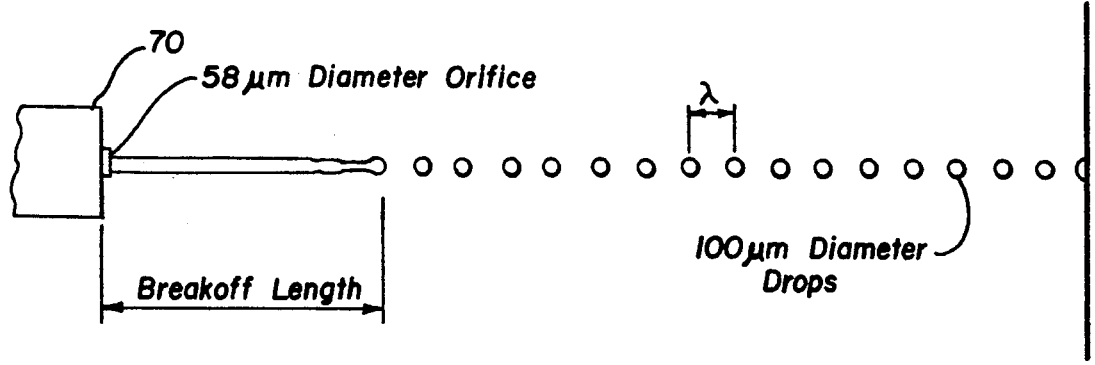
FIG. 10 is a simplified pictorial illustrating the formation of solder balls by the present invention.

FIG. 10 depicts the ejection of generally spherical-shaped quantities of liquid solder 44 from ejection device 70 of the charge-and-deflection type with an orifice diameter of 58 $\mu$m and operating at a frequency of 15 kilohertz and a velocity of 3.5 m/sec. The diameter of the solder drops 80 is 100 $\mu$m. The wavelength $\lambda$ of the stream of solder drops 80 is 230 $\mu$m.

Figure 11:
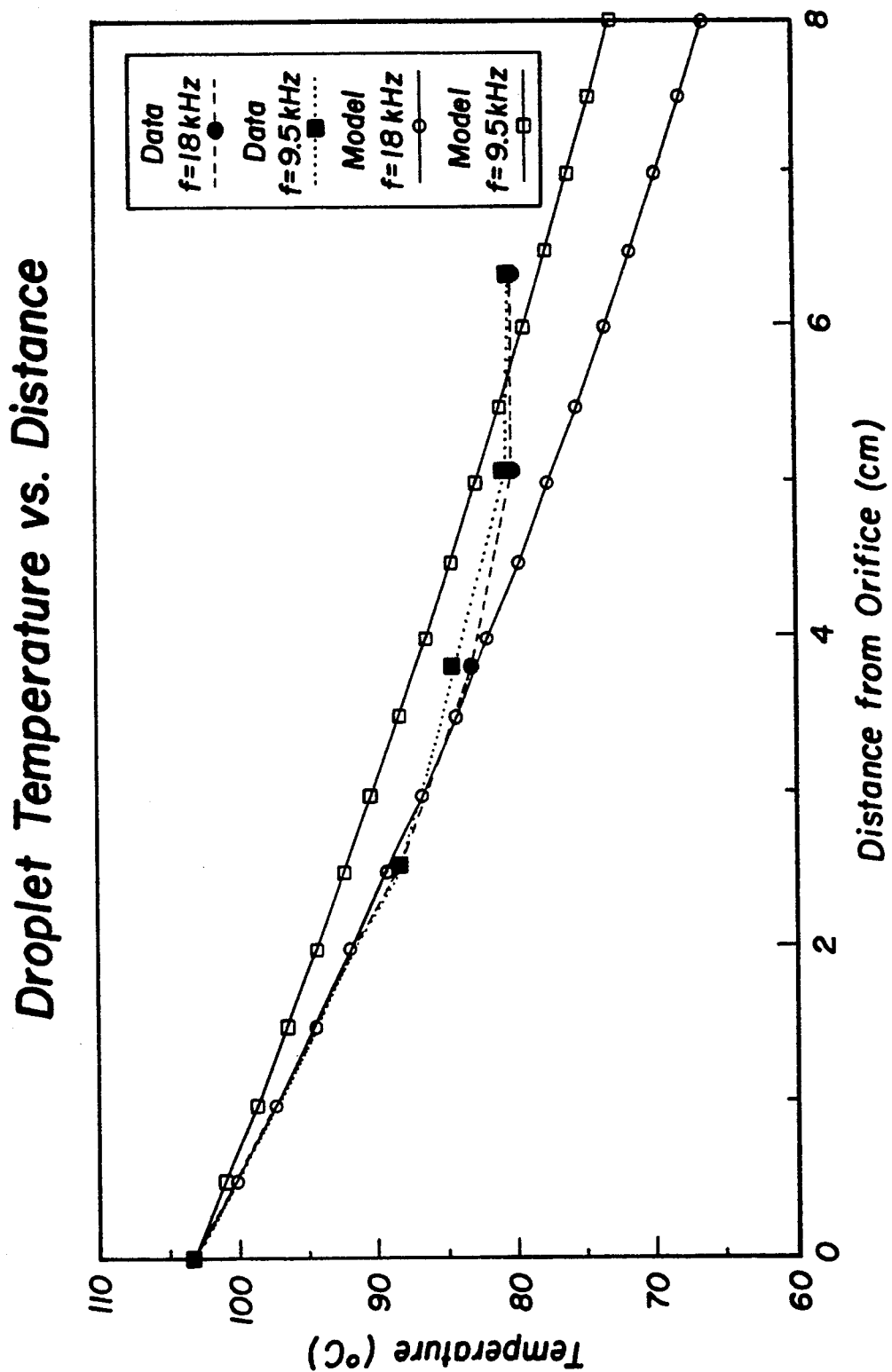
FIG. 11 is a graphic illustration of droplet temperature vs distance from the ejection device of the present invention.

FIG. 11 depicts the comparison of results of the operation of ejection device 70 with comparable curves derived by a computer model for droplet temperature vs distance from the ejection device 70 and shows that the operation of the inventive system is predictable and that the temperature of the solder drops or droplets 80 which is desired at the point of deposit on a pad, etc., can be chosen by merely placing the pad at the correct distance from the ejection device 70.

Figure 12:
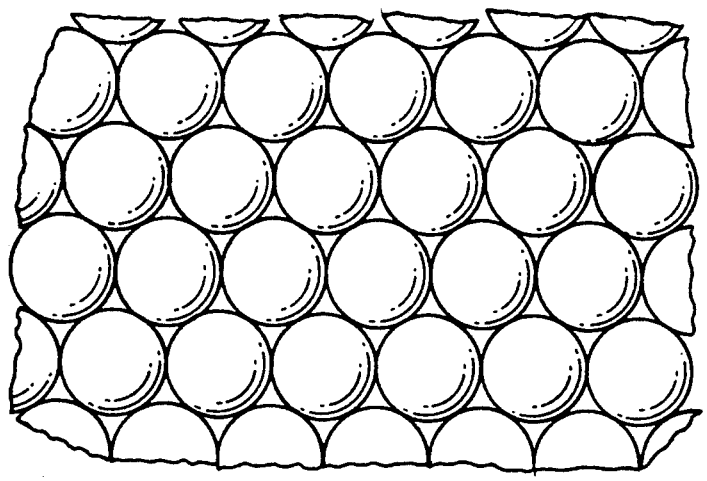
FIGS. 12–14 depict various arrays of solder balls produced by the present invention.
Figure 13:
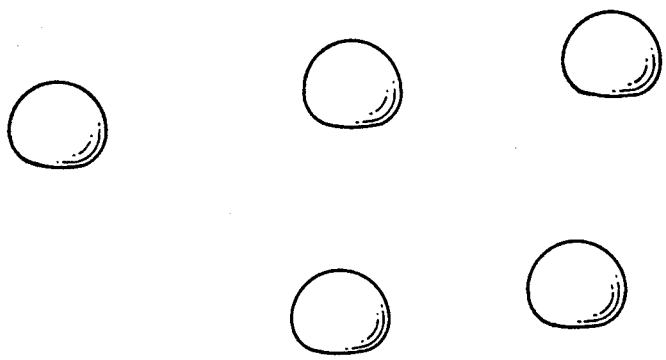
Figure 14:
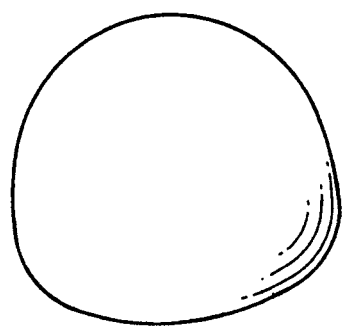

FIGS. 12-14 illustrate magnified views of solder balls 86 with a diameter of 110 microns produced by the present invention.

With reference to FIG. 5, the operation of present invention begins with the solid solder being placed in preload reservoir 42. The solder comprises an eutectic alloy of at least two of the elements lead, tin, bismuth and indium. Power is applied to heating element 46 to bring the temperature of the particular solder to the melting point. After the solder is melted in the preload reservoir 42, a portion thereof is transferred through conduit 54 and valve 56 to the ejection chamber 52 where the solder 44 is maintained in a liquid state by heating element 58. Ejection chamber 52 is pressurized with an inert gas, e.g. nitrogen, from 10 to 30 psi. The pressure forces liquid solder 44 through filter 68 into ejection device 70. Ejection device 70 is structured to have a nozzle opening of 25 to 100 microns in diameter and to be excited from drive electronics 78 with a signal having a frequency between 2000 to 100,000 hertz. Upon excitation of the ejection device 70 drops 80 of liquid solder 44 are ejected to become individual solder balls 86, as shown in FIG. 5, or solder balls 86 deposited on pads 16 of chip 10, as shown in FIG. 6.

The advantages of the present invention are many and include the ability to easily adjust the diameter size of the solder ball 86. In the drop-on-demand ejection device 70, small changes in the diameter of the solder ball 86 require only a change in the excitation voltage. Large changes require a change in the size of the orifice 104 of the ejection device 70. In the charge-and-deflection ejection device 70, changes are only required in frequency of the excitation voltage. The present invention can produce several thousand solder balls 86 per second. The equipment is less expensive than the prior art equipment. Personnel need not handle the individual solder balls which can be dangerous because of their small size. Flux may also be dispensed. Different layouts of pads on the chip only require a program change to the programmable controller.

From the foregoing detailed description it can be appreciated that solder ejecting apparatus constructed and operated in accordance with this invention provides an improved apparatus and method of making solder balls and also of applying solder balls on pads of a chip which is faster and more accurate resulting in a less costly operation.

Although the present invention has been described with reference to a presently preferred embodiment, it will be appreciated by those skilled in the art that various modifications, alternatives, variations, etc., may be made without departing from the spirit and scope of the invention as defined in the appended claims.

We claim:

1. The method of applying generally spherical-shaped drops of liquid solder through a controlled atmosphere to a surface to be wetted comprising the steps of:
    (a) maintaining solder in a liquid state in an ejection chamber;
    (b) pressurizing said ejection chamber with an inert gas;
    (c) transferring solder in the liquid state from said ejection chamber to an ejection device;
    (d) filtering the liquid solder as the liquid solder is transferred from said ejection chamber to said ejection device; and
    (e) ejecting generally spherical-shaped drops of liquid solder from said ejection device to a specific location on a surface to be wetted.

2. The method set forth in claim 1 further including the steps of:
    (a) maintaining solder in a liquid state in a reservoir; and (b) transferring solder in the liquid state from said reservoir to said ejection chamber.

3. The method set forth in claim 1 further including the step of providing an atmosphere of inert gas between said ejection device and said specific location on a surface to be wetted.

4. The method set forth in claim 1 further including the step of maintaining the transferred solder in the liquid state in said ejection device.

5. The method set forth in claim 1 wherein said ejection device comprises a drop-on-demand system.

6. The method of set forth in claim 1 wherein said ejection device comprises a charge-and-deflection system.

7. The method set forth in claim 1 wherein said specific location on a surface to be wetted comprises individual wettable metal pads on an integrated circuit chip.

8. The method set forth in claim 1 wherein said specific location on a surface to be wetted comprises connect pads on a packaging substrate.

9. The method set forth in claim 1 further including the step of ejecting generally spherical-shaped drops of liquid flux from another ejection device to said specific location so that the generally spherical-shaped drops of liquid flux arrive at said specific location before said generally spherical-shaped drops of liquid solder arrive at said specific location.

10. The method set forth in claim 1 further including the step of ejecting generally spherical-shaped drops of liquid flux from another ejection device to said specific location so that the generally spherical-shaped drops of liquid flux arrive at said specific location at the same time that said generally spherical-shaped drops of liquid solder arrive at said specific location.

11. The method of ejecting generally spherical-shaped drops of liquid solder through a controlled atmosphere to produce solidified solder balls of spherical shape comprising the steps of:
(a) maintaining solder in a liquid state in an ejection chamber;
(b) pressurizing said ejection chamber with an inert gas;
(c) transferring solder in the liquid state from said ejection chamber to an ejection device;
(d) filtering the liquid solder as the liquid solder is transferred from said ejection chamber to said ejection device; and
(e) ejecting generally spherical-shaped drops of liquid solder from said ejection device to a catcher.

12. The method set forth in 11 further including the steps of:
(a) maintaining solder in a liquid state in a reservoir; and
(b) transferring solder in the liquid state from said reservoir to said ejection chamber.

13. The method set forth in claim 11 further including the step of providing an atmosphere of inert gas between said ejection device and said catcher.

14. The method set forth in claim 11 further including the step of maintaining the transferred solder in the liquid state in said ejection device.

15. The method set forth in claim 11 further including the step of maintaining the level of the liquid solder in said ejection chamber above a predetermined level.

16. The method set forth in claim 11 wherein said ejection device comprises a drop-on-demand system.

17. The method set forth in claim 11 wherein said ejection device comprises a charge-and-deflection system.

18. The method of applying generally spherical-shaped drops of liquid solder through a controlled atmosphere to a surface to be wetted comprising the steps of:
(a) maintaining solder in a liquid state in a reservoir;
(b) transferring solder in the liquid state from said reservoir to an ejection chamber;
(c) maintaining solder in a liquid state in said ejection chamber;
(d) pressurizing said ejection chamber with inert gas;
(e) transferring solder in the liquid state from said ejection chamber to an ejection device; and
(f) ejecting generally spherical-shaped drops of liquid solder from said ejecting device to a specific location on a surface to be wetted.

19. The method set forth in claim 18 further including the step of providing an atmosphere of inert gas between said ejection device and said specific location on a surface to be wetted.

20. The method set forth in claim 18 further including the step of maintaining the transferred solder in the liquid state in said ejecting device.

21. The method set forth in claim 18 further including the step of filtering the liquid solder as the liquid solder is transferred from said ejection chamber to said ejection device.

22. The method set forth in claim 18 wherein said ejection device comprises a drop-on-demand system.

23. The method set forth in claim 18 wherein said ejection device comprises a charge-and-deflection system.

24. The method set forth in claim 18 wherein said specific location on a surface to be wetted comprises individual wettable metal pads on an integrated circuit chip.

25. The method set forth in claim 18 wherein said specific location on a surface to be wetted comprises connect pads on a packaging substrate.

26. The method set forth in claim 18 further including the step of ejecting generally spherical-shaped drops of liquid flux from another ejection device to said specific location so that the generally spherical-shaped drops of liquid flux arrive at said specific location before said generally spherical-shaped drops of liquid solder arrive at said specific location.

27. The method set forth in claim 18 further including the step of ejecting generally spherical-shaped drops of liquid flux from another ejection device to said specific location so that the generally spherical-shaped drops of liquid flux arrive at said specific location at the same time that said generally spherical-shaped drops of liquid solder arrive at said specific location.

28. The method of ejecting generally spherical-shaped drops of liquid solder through a controlled atmosphere to produce solidified solder balls of spherical shape comprising the steps of:
(a) maintaining solder in a liquid state in a reservoir;
(b) transferring solder in the liquid state from said reservoir to an ejection chamber;
(c) maintaining solder in a liquid state in said ejection chamber;
(d) pressurizing said ejection chamber with inert gas;
(e) transferring solder in the liquid state from said ejection chamber to an ejection device; and (f) ejecting generally spherical-shaped drops of liquid solder from said ejecting device to a catcher.

29. The method set forth in claim 28 further including the step of providing an atmosphere of inert gas between said ejection device and said catcher.

30. The method set forth in claim 28 further including the step of maintaining the transferred solder in the liquid state in said ejection device.

31. The method set forth in claim 28 further including the step of filtering the liquid solder as the liquid solder is transferred from said ejection chamber to said ejection device.

32. The method set forth in claim 28 further including the step of maintaining the level of the liquid solder in said ejection chamber above a predetermined level.

33. The method set forth in claim 28 wherein said ejection device comprises a drop-on-demand system.

34. The method set forth in claim 28 wherein said ejection device comprises a charge-and-deflection system.

* * * * *

UNITED STATES PATENT AND TRADEMARK OFFICE
CERTIFICATE OF CORRECTION

PATENT NO. : 5,229,016

DATED : July 20, 1993

INVENTOR(S) : Donald J. Hayes, et al.

It is certified that error appears in the above-identified patent and that said Letters Patent is hereby corrected as shown below:

Column 1, line 7,   delete "of"

Column 1, line 38,  delete "$"

Column 1, line 44,  delete "o"

Column 2, lines 19 and 20,  delete "photolithograph" and insert ---photolithography---

Column 2, line 66,  delete "crops or" and insert --drops of--

Column 4, line 35,  delete "and"

Column 4, line 36,  after "shape" and insert ---and---

Column 4, line 46,  delete "for" and insert ---form---

Column 5, line 12,  delete "of"

Column 5, line 13,  after "device" insert ---of---

Column 5, line 53,  delete "the" (first occurrence) and insert ---a---

Column 5, line 65,  delete "the"

UNITED STATES PATENT AND TRADEMARK OFFICE
CERTIFICATE OF CORRECTION

PATENT NO. : 5,229,016
DATED : July 20, 1993
INVENTOR(S) : Donald J. Hayes, et al It is certified that error appears in the above-indentified patent and that said Letters Patent is hereby corrected as shown below:

Column 5, line 65, --the-- is inserted after the word of and before present.

Signed and Sealed this

Twenty-second Day of March, 1994

Attest:

BRUCE LEHMAN

Attesting Officer        Commissioner of Patents and Trademarks

(12) REEXAMINATION CERTIFICATE (4660th)
United States Patent
Hayes et al.

(10) Number: US 5,229,016 C1
(45) Certificate Issued: Oct. 22, 2002

(54) METHOD FOR DISPENSING SPHERICAL-SHAPED QUANTITIES OF LIQUID SOLDER

(75) Inventors: Donald J. Hayes, Plano, TX (US); Michael T. Boldman, Garland, TX (US); David B. Wallace, Dallas, TX (US)

(73) Assignee: Microfab Technologies, Inc., Plano, TX (US)

Reexamination Request:
No. 90/006,075, Aug. 2, 2001

Reexamination Certificate for:
Patent No.: 5,229,016
Issued: Jul. 20, 1993
Appl. No.: 07/742,362
Filed: Aug. 8, 1991

Certificate of Correction issued Mar. 22, 1994.

(51) Int. Cl.[7] ................ B22D 37/00; B23K 31/02
(52) U.S. Cl. ............... 222/590; 222/593; 222/595; 228/33; 228/260; 228/262; 228/207; 228/254; 347/1
(58) Field of Search ............... 228/33, 260, 262; 75/331, 335, 407; 222/590, 593, 595; 264/9, 13; 425/6

(56) References Cited

U.S. PATENT DOCUMENTS 4,428,894 A 1/1984 Bienvenu

OTHER PUBLICATIONS

Proceedings of the 1989 International Symposium on Microelectronics, Oct. 24–26, 1989 Baltimore Convention Center Sponsored by the International Society for Hybrid Microelectronics, pp 627–634. Title: Application of Ink Jet Technology to Microelectronic Packaging Authors: Donald J. Hayes and David B. Wallace of MicroFab Technologies, Inc. Transactions of the ASME—quarterly publication by the American Society of Mechanical Engineers. June 1989 issue, vol. 111, pp. 108–111 Title: Automated Electronic Circuit Manufacturing Using Ink–Jet Technology Author: D.B. Wallace of MicroFab Technologies, Inc.

*Primary Examiner*—Melvyn Andrews

(57) ABSTRACT

A method and apparatus for producing solidified solder balls and for ejecting generally spherical-shaped drops of liquid solder through a controlled atmosphere to impact on a surface to be wetted is disclosed. The apparatus comprises a preload reservoir to hold and maintain solder in a liquid state, an ejection chamber to hold and maintain the solder in a liquid state, a connection between the preload reservoir and the ejection chamber to allow liquid solder in the preload reservoir to be transferred to the ejection chamber while maintaining the oxides in the preload reservoir, a device to pressurize the ejection chamber with an inert gas and an ejection device operatively connected to receive liquid solder from the ejection chamber and to eject generally spherical-shaped drops of liquid solder to a specific location on a surface to be wetted. Structure is included to provide an atmosphere of inert gas between the ejection device and the specific location on a surface to be wetted.

The method includes the steps of maintaining solder in a liquid state in a reservoir, transferring solder in the liquid state from the reservoir to an ejection chamber, maintaining the transferred solder in a liquid state in the ejection chamber, pressurizing the ejection chamber with an inert gas, transferring solder in the liquid state from the ejection chamber to an ejection device, ejecting generally spherical-shaped drops of liquid solder from said ejection device to a specific location on a surface to be wetted. An atmosphere of inert gas is provided between the ejection device and the specific location on a surface to be wetted.

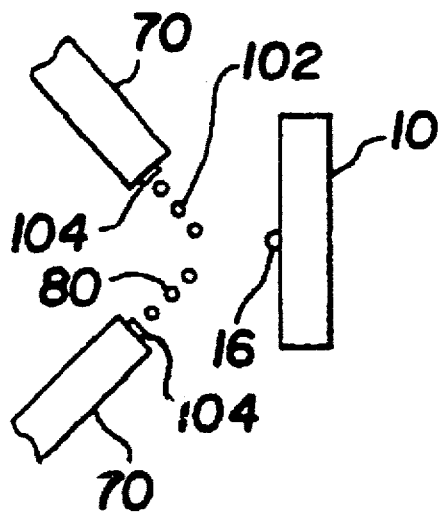

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–10 and 18–27 is confirmed.

Claims 11 and 28 are determined to be patentable as amended.

Claims 12–17 and 29–34, dependent on an amended claim, are determined to be patentable.

11. The method of ejecting generally spherical-shaped drops of liquid solder through a controlled atmosphere to produce solidified solder balls of spherical shape comprising the steps of:
  (a) maintaining solder in a liquid state in an ejection chamber;
  (b) pressurizing said ejection chamber with an inert gas;
  (c) transferring solder in the liquid state from said ejection chamber to an ejection device, *said ejection device including a fluid inlet for receiving the solder in the liquid state, a piezoelectric transducer, and an orifice through which generally spherical-shaped drops of liquid solder are ejected*;
  (d) filtering the liquid solder as the liquid solder is transferred from said ejection chamber to said ejection device; and
  (e) *energizing said piezoelectric transducer to thereby impart energy to the solder in the liquid state in said ejection device in proximity to said orifice and ejecting the* generally spherical-shaped drops of liquid solder from said *orifice of said* ejection device to a catcher.

28. The method of ejecting generally spherical-shaped drops of liquid solder through a controlled atmosphere to produce solidified solder balls of spherical shape comprising the steps of:
  (a) maintaining solder in a liquid state in a reservoir;
  (b) transferring solder in the liquid state from said reservoir to an ejection chamber;
  (c) maintaining solder in a liquid state in said ejection chamber;
  (d) pressurizing said ejection chamber with inert gas;
  (e) transferring solder in the liquid state from said ejection chamber to an ejection device, *said ejection device including a fluid inlet for receiving the solder in the liquid state, a piezoelectric transducer, and an orifice through which generally spherical-shaped drops of liquid solder are ejected*; and
  (f) *energizing said piezoelectric transducer to thereby impart energy to the solder in the liquid state in said ejection device in proximity to said orifice and ejecting the* generally spherical-shaped drops of liquid solder from said *orifice of said* ejecting device to a catcher.

\* \* \* \* \*